United States Patent
Qi

(10) Patent No.: US 9,176,018 B2
(45) Date of Patent: Nov. 3, 2015

(54) MICROMACHINED ULTRA-MINIATURE PIEZORESISTIVE PRESSURE SENSOR AND METHOD OF FABRICATION OF THE SAME

(71) Applicant: Bin Qi, Saratoga, CA (US)

(72) Inventor: Bin Qi, Saratoga, CA (US)

(*) Notice: Subject to any disclaimer, the term of this patent is extended or adjusted under 35 U.S.C. 154(b) by 64 days.

(21) Appl. No.: 14/187,221

(22) Filed: Feb. 22, 2014

(65) Prior Publication Data
US 2014/0242740 A1    Aug. 28, 2014

Related U.S. Application Data

(60) Provisional application No. 61/768,018, filed on Feb. 22, 2013.

(51) Int. Cl.
| | |
|---|---|
| *H01L 29/66* | (2006.01) |
| *G01L 9/00* | (2006.01) |
| *H01L 49/02* | (2006.01) |
| *H01L 21/764* | (2006.01) |

(52) U.S. Cl.
CPC ............ *G01L 9/0055* (2013.01); *G01L 9/0044* (2013.01); *G01L 9/0045* (2013.01); *G01L 9/0054* (2013.01); *G01L 9/0048* (2013.01); *G01L 9/0052* (2013.01); *H01L 21/764* (2013.01); *H01L 28/20* (2013.01)

(58) Field of Classification Search
CPC ..... H01L 28/20; H01L 21/764; G01L 9/0054; G01L 9/0045; G01L 9/0073; G01L 9/0055; G01L 9/0052; G01L 9/0048
See application file for complete search history.

(56) References Cited

U.S. PATENT DOCUMENTS

| | | | | |
|---|---|---|---|---|
| 5,242,863 | A * | 9/1993 | Xiang-Zheng et al. | 438/53 |
| 6,973,835 | B2 * | 12/2005 | Rangsten et al. | 73/754 |
| 7,111,518 | B1 * | 9/2006 | Allen et al. | 73/715 |
| 7,207,227 | B2 * | 4/2007 | Rangsten et al. | 73/754 |
| 2013/0220972 | A1 * | 8/2013 | Gamage | 216/39 |

* cited by examiner

*Primary Examiner* — Kimberly Rizkallah
*Assistant Examiner* — Alexander Belousov
(74) *Attorney, Agent, or Firm* — Ya-Fen Chen

(57) ABSTRACT

A method of fabrication of one or more ultra-miniature piezoresistive pressure sensors on silicon wafers is provided. The diaphragm of the piezoresistive pressure sensors is formed by fusion bonding. The piezoresistive pressure sensors can be formed by silicon deposition, photolithography and etching processes.

20 Claims, 8 Drawing Sheets

MICROMACHINED ULTRA-MINIATURE PIEZORESISTIVE PRESSURE SENSOR AND METHOD OF FABRICATION OF THE SAME

CROSS-REFERENCE TO RELATED APPLICATIONS

This application claims benefit of U.S. provisional patent application Ser. No. 61/768,018, filed on Feb. 22, 2013, which is herein incorporated by reference.

FIELD OF THE INVENTION

This invention generally relates to micromachined piezoresistive pressure sensor and more particularly to a method of fabricating micromachined ultra-miniature piezoresistive pressure sensor for low pressure applications by applying wafer-bonding technology to form silicon diaphragms over etched cavities and deep silicon etching approach to define the outlines of the fabricated sensors.

BACKGROUND OF THE INVENTION

It is well know that monitoring physiological parameters in situ and in vivo within a blood vessel of a human subject being diagnosed or treated during a medical procedure can provide medical professionals critical information as to the status and condition of the human subject. One particular important and beneficial physiological parameter is the blood pressure within the coronary vessel. Study has shown that the blood pressure in situ and in viva within the coronary vessel can be applied to calculate Fractional Flow Reserve (FFR) which represents the potential decrease in coronary flow distal to the coronary stenosis. More than a decade long clinic study has shown that FFR can provide a quantitative assessment of the functional severity of a coronary artery stenosis identified during coronary angiography and cardiac catheterization, hence, helping the physician to make a quantitative decision on which kind of further treatment is required.

Due to the small diameter of the coronary vessel, which can be as small as less than 1 mm in diameter, it is crucial to have a very small diagnosis device to measure the blood pressure in situ so the blood pressure is not distorted by the diagnosis device itself. In such case, an ultra small pressure sensor is mounted at the distal end of an ultra small delivering device such as a guide wire to form a sensor guide wire assembly. By advancing the distal end of the sensor guide wire assembly to the desired location within the coronary vessel, the ultra miniature pressure sensor mounted at the distal end of the guide wire can perform the measurement of the blood pressure of the coronary vessel in situ and in viva. The Outside Diameter (OD) of the sensor guide wire assembly is typically 0.35 mm. Hence an ultra small sensor is required so the sensor can be mounted at the distal end of the sensor guide wire assembly.

Therefore it is apparent that there is a need to manufacture miniature pressure sensors which can be mounted at the distal end of delivering devices such as guide wires. In order to mount the pressure sensor on a guide wire whose typical Outside Diameter (OD) is about 0.35 mm, the size of the sensor needs to be smaller than 0.3 mm in width and 0.1 mm in height. To fabricate pressure sensors with this small dimension presents a challenge for mass production.

SUMMARY OF THE INVENTION

This application generally discloses a method of fabrication piezoresistive pressure sensors. More specifically, it discloses an improved MEMS process for fabricating piezoresistive pressure sensors which include a thin film diaphragm overlying a cavity with enhanced processes to provide improved sensitivity of ultra miniature pressure sensors which can be mounted on the distal end of a guide wire.

One embodiment provides a piezoresistive pressure sensor fabricating method which can precisely define the dimensions of the pressure sensors by employing photolithography technology and etching trenches partially enclosing the sensors to define the dimensions of the sensors and the sensors can be released by applying mechanical force without dicing.

Another embodiment provides a peiozoresistive pressure sensor fabricating method which can precisely define the dimensions of the pressure sensors by employing photolithography technology and etching trenches completely enclosing the sensors to define the dimensions of the sensors and the sensors can be released using standard MEMS process without dicing.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1A:
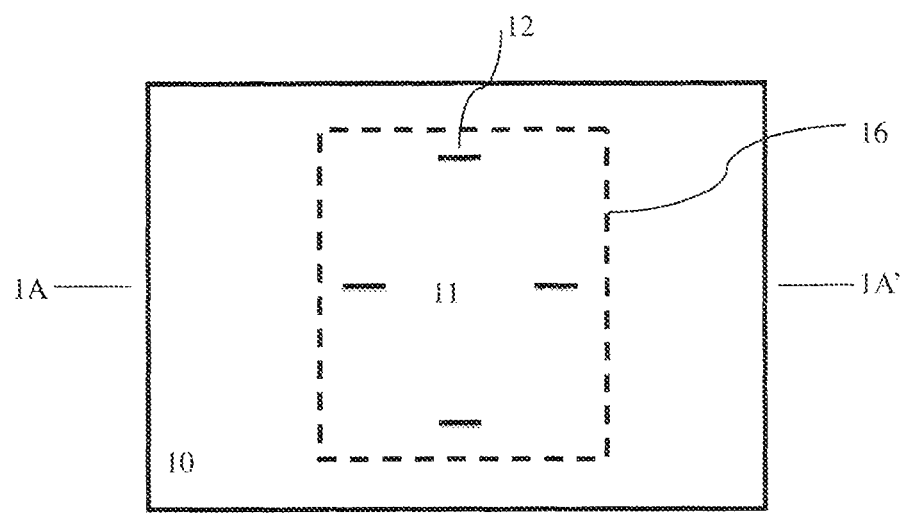
FIG. 1A illustrates the top view of an exemplary yet typical piezoresistive pressure sensor.
Figure 1B:
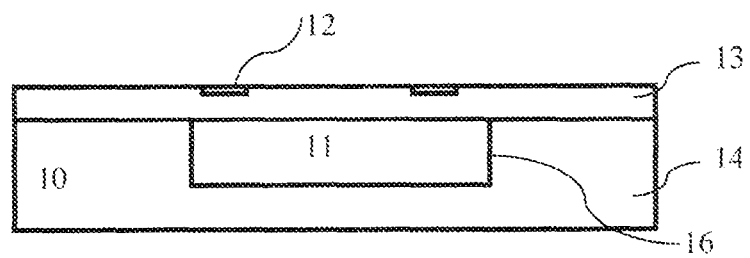
FIG. 1B illustrates the cross-sectional side view of the pressure sensor shown in FIG. 1A. The cross-sectional view section is along line 1A-1A' of FIG. 1A.

FIG. 1A and FIG. 1B illustrate a method of manufacturing a miniature pressure sensor and fabricating one or more piezoresistive pressure sensors 10 using Micro-Electro-Mechanical Systems (MEMS) technology. FIG. 1A illustrates the top view of a piezoresistive pressure sensor. FIG. 1B illustrates the cross-sectional view of the piezoresistive pressure sensor in FIG. 1A. The cross-sectional view in FIG. 1B is along line 1A-1A' of FIG. 1A.

The pressure sensor 10 is formed by a thin film diaphragm 13 overlying a cavity 11. The dotted line in FIG. 1A represents the edge 16 of the cavity 11 and hence defines the region of the cavity 11. Piezoresistors 12 are formed on top of the diaphragm 13 within the cavity 11 region by either diffusion or ion implantation. When pressure is applied on top of the diaphragm 13, the diaphragm 13 will deform and bend into the cavity 11, resulting in stress on the piezoresistors 12 hence changing the resistances of the piezoresistors 12.

One important parameter to characterize a pressure sensor is the sensitivity of the sensor. For a given pressure change, the larger the resistance change is, the higher the sensitivity is. The major goal of the pressure sensor design is to achieve as high sensitivity as possible.

The sensitivity of the piezoresistive pressure sensor described above is affected by the thickness of the diaphragm 13. The thinner is the diaphragm 13, the more sensitive is the pressure sensor. However, the thickness of the diaphragm 13 also affects the pressure range the sensor can measure. The thinner is the diaphragm 13, the lower pressure the sensor can measure before the change of the resistance of the piezoresistor 12 becomes nonlinear. It is beneficial is to choose a diaphragm 13 with smallest thickness but large enough for the given dimensions of the cavity 11 so the change of the resistance of the piezoresistor 12 is linear within all the pressure range the device is designed to measure.

The sensitivity of the piezoresistive pressure sensor 10 is also affected by the dimension of the cavity 11. The larger the cavity 11 is, the more sensitive the pressure sensor 10 is. When the space is not a limiting factor, it is beneficial to design the dimension of the piezoresistive sensor, hence the dimension of the cavity 11, to be large enough to satisfy the sensitivity requirement. When the space is a limiting factor, such as the case for intra cardiac and intra vascular applications, the dimension of the piezoresistive sensor, hence the dimension of the cavity 11, is designed to be maximum allowable by the limited space to achieve maximum achievable sensitivity.

For intra cardiac infra vascular, and Percutaneous Coronary Intervention (PCI) applications, it's preferable to mount the pressure sensor on a guide wire with a Outer Diameter (OD) of about 0.35 mm so no extra device is required to perform the blood pressure measurement in situ and in vivo. In order to mount the above described piezoresistive pressure sensor on a guide wire, the width of the pressure sensor needs to be smaller than 0.3 mm. This small dimension presents a challenge for manufacturing the above described piezoresistive pressure sensor with traditionally available MEMS processes which includes a wafer dicing process to separate the fabricated devices. The first challenge is that the dimension is too small for standard semiconductor dicing equipment to handle. A semiconductor dicing equipment is only designed to handle devices with lateral dimensions not smaller than 1 mm in any direction. Hence special equipment is required, resulting in increased manufacture cost. The second challenge is caused by the dicing error, which is 0.05 mm for most of the commercially available dicing saws. In order to guaranty the finished width is smaller than 0.3 mm, the width of the device needs to be smaller than 0.2 mm so after the dicing error its width will still be smaller than 0.3 mm. Reducing the width from 0.3 mm to 0.2 mm will result in 33% of sensor area reduction, hence 33% of sensitivity reduction.

One intention of this invention is to provide a fabrication method of fabricating piezoresistive pressure sensor whose dimension can be precisely defined, hence to eliminate above mentioned problem of reduction of sensitivity for ultra small piezoresistive pressure sensor due to the uncertainty of the dimension of the finished device. Another intention of this invention is to provide a fabrication method of fabricating piezoresistive pressure sensor with increased sensitivity. Another intention of this invention is to provide a fabrication method which only uses semiconductor compatible processes to fabricate piezoresistive pressure sensor. Yet another intention of this invention is to provide a MEMS process flow which can be used to manufacture piezoresistive pressure sensor in mass production with high yield and low cost.

The method of fabrication of piezoresistive pressure sensor whose diaphragm 13 is formed by employing wafer bonding and whose dimension is precisely defined by employing photolithographic and etching process is described in detail along with the FIGs, in which like parts are generally denoted with like reference numbers and letters. The FIGs are for illustration only and are not to scale.

The steps of fabricating of piezoresistive pressure sensor in accordance with the present invention employ fusion wafer bonding under vacuum and etching process to define the dimension of the finished pressure sensors are illustrated and described with reference to FIG. 1 through FIG. 11. The fabrication process starts with two wafers with silicon-on-insulator (SOI) structures thereon.

Figure 2A:
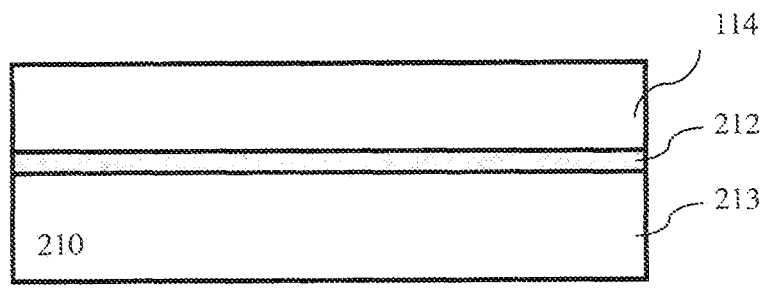
FIG. 2A and FIG. 2B illustrates the cross-sectional view of the first silicon-on-insulator (SOI) wafer working as a carrier wafer where the cavity is formed on the silicon layer.

As illustrated in FIG. 2A, as an example, a first SOI wafer 210, having a bulk silicon layer 213 thereon, can work generally as a carrier wafer for fabricating the pressure sensor 10. The first SOI wafer 210 may also include an oxide layer 212 deposited over the bulk silicon layer 213 and a silicon layer 114 deposited over the oxide layer 213.

A cavity 111 is built on the silicon layer 114 of the first SOI wafer 210 for fabricating a pressure sensor, such as the pressure sensor 10, therein. The silicon layer 114, the oxide layer 212, and the bulk silicon layer 213 are thus formed into a silicon-on-insulator (SOI) structure on the first SOI wafer 210.

During fabrication of the pressure sensor 10, first, the cavity 111 of the pressure sensor is formed on a carrier wafer, such as the first SOI wafer 210. The silicon layer 114 is relatively thick, as it is where the cavity 111 is going to be formed. In one embodiment, the thickness of the silicon layer 114 on the first SOI wafer 210 is between about 5 μm and about 100 μm. While the thickness of the silicon layer 114 of this SOI wafer 210 is not critical to the performance of the piezoresistive pressure sensor 10, the thickness of the silicon layer 114 needs to be shorter than the height limit, if there is any, of the finished sensor 10. The thickness of the silicon layer 114 also affects the limit of the height of the cavity 111 since the cavity 111 needs to be formed within the silicon layer 114 of the first SOI wafer 210.

For low pressure applications, such as blood pressure measurement, the cavity 111 does not need to be high. A height of between about 2 μm and about 50 μm in the cavity 111 is typically sufficient. Hence a thickness of between about 5 μm and about 100 μm in the silicon layer 114 on the first SOI wafer 210 can be used.

Figure 2B:
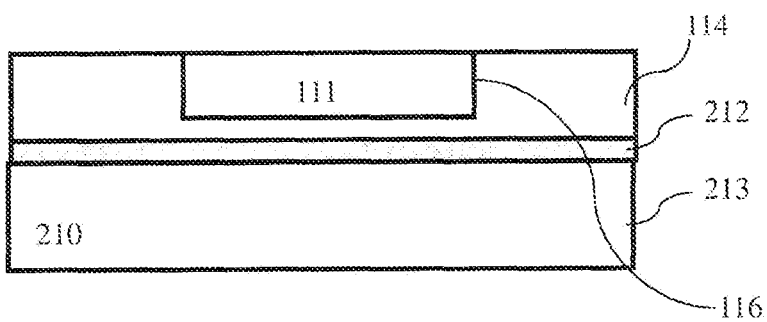

As shown in FIG. 2B, a pattern of the cavity 111 can be formed in the silicon layer 114. In general, a mask with openings is used to form and define the shape and pattern of the cavity 111 using photolithography techniques. The shape of the cavity 111 determines the shape of the area where one or more piezoresistors 112 is going to be formed. The most widely used shape is square while rectangular shapes, circular shapes and other shapes are also used.

After the photolithograph, plasma etching technique can be used to form the cavity 111. The time duration and the energy of the plasma etching define the height of the cavity 111. The height of the cavity 111 needs to be much shorter than the thickness of the silicon layer 114, for example, less than half of the thickness of the silicon layer 114. The detailed steps of forming the cavity 111 on the first SOI wafer 210 is well known to those skilled in the art of the MEMS processes. In some cases, it is possible to directly use a silicon-on-insulator wafer which has the cavity 111 already built-in.

Figure 3:
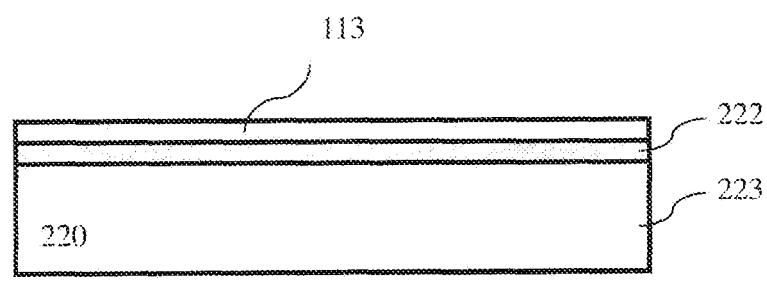
FIG. 3 illustrates the cross-sectional view of the second SOI wafer whose silicon layer is used to form the diaphragm in according to one embodiment of the present invention.

FIG. 3 shows one example of using a second SOI wafer 220 to provide a thin silicon layer for forming the diaphragm 13 of the piezoresistive pressure sensor 10. The second SOI wafer 220 generally includes a bulk silicon layer 213, an oxide layer 222, and a thin layer of a silicon layer 113, thereby forming a second silicon-on-insulator (SOI) structure. The thickness of the silicon layer 113 can be as thin as between about 0.5 μm and about μm, for forming the diaphragm 13 of the pressure sensor 10.

The thickness of the silicon layer 113 of the second SOI wafer 220 defines the thickness of the diaphragm 13. For a given cavity dimension, the thinner the diaphragm 13 is, the more sensitive the pressure sensor 10 is to a change in pressure. On the other hand, for the same given cavity dimension, the thinner the diaphragm 13 of the pressure sensor 10 is, the smaller the maximum pressure it can tolerate. In general, a thickness of the silicon layer and the thickness of the diaphragm 13 are thick enough to be able to tolerate the maximum pressure the pressure sensor 10 is going to be exposed to, resulting in maximum sensitivity within the designed pressure range for a given cavity dimension. For miniature small-scale pressure sensor, such as those suitable for intravascular pressure monitoring where sensitive blood pressure change is measured, the silicon layer 113 can have a thickness of between about 0.5 μm and about 5 μm. Since the silicon layer 113 is provided for forming the diaphragm 13, the type of a silicon material for the silicon layer 113 is chosen to be opposite to the type of a silicon material for one or more piezoresistors, such as the piezoresistors 12 or one or more piezoresistors 112, as described below.

When a p-type doping is used to form the piezoresistor 12, a n-type doped silicon material can be chosen to form the silicon layer 113. Likewise, when a n-type doping is used to form the piezoresistor 12, a p-type doped silicon material can be chosen to form the silicon layer 113. This is to limit the leakage from the piezoresistor 12 to the substrate of the diaphragm 13. Even though it is not required, it is also preferable to choose a low impedance silicon material for forming the silicon layer 113.

Figure 4:
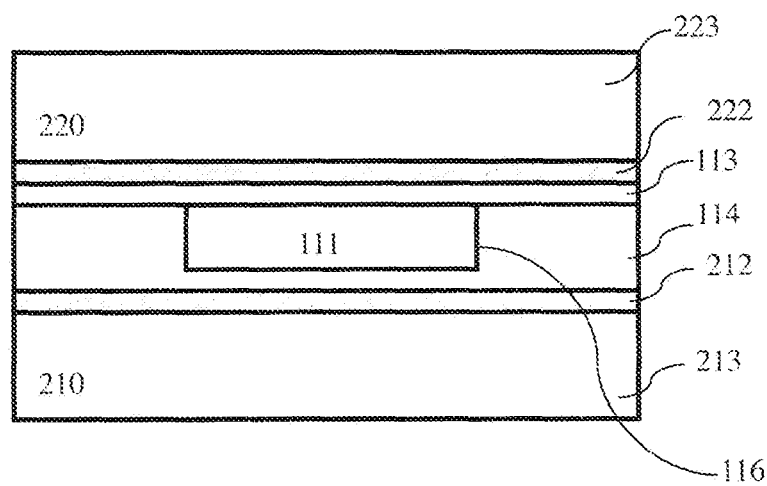
FIG. 4 illustrates the structure after the first and the second SOI wafers are bonded together according to one embodiment of the present invention.

Next, as shown in FIG. 4, the second SOI wafer 220 can be placed over the first SOI wafer 210 with the silicon layer 113 facing the silicon layer 114, where the cavity 111 of the carrier wafer 210 is. The first SOI 210 and the second SOI wafers 220 are then bonded together by employing suitable techniques, for example, fusion wafer bonding under vacuum. If the bonding is done under very low pressure, the formed cavities are vacuum-sealed. In addition, other bonding methods such as eutectic bonding can be applied to bond the first silicon-on-insulator wafer and the second silicon-on-insulator wafer together.

Figure 5:
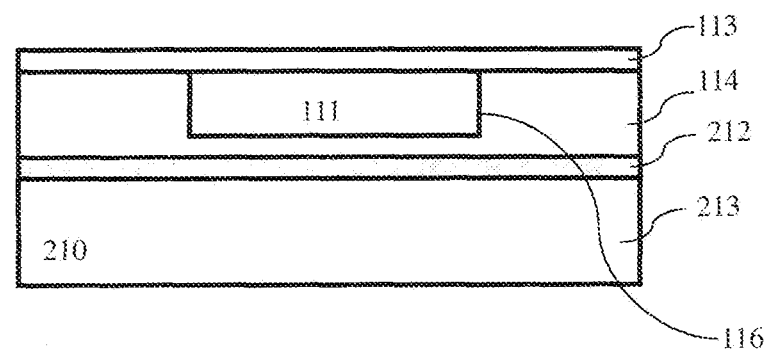
FIG. 5 illustrates the structure after the supporting silicon wafer and insulation layer of the second SOI wafer has been removed according to one of the embodiment of the present invention.

After bonding and sealing, the bulk silicon layer 223 and the oxide layer 222 of the second SOI wafer 220 are removed by a grinding process and an etching process, respectively. Accordingly, as illustrated in FIG. 5, only the silicon layer 113 is remained over the surface of the first SOI wafer 210, atop the surfaces of the cavity 111 and the silicon layer 114. The detailed processed to bond the first and the second SOI wafers 210, 220 together using fusion bonding under vacuum and removing the silicon support wafer 223 and oxide layer 222 is well known to those skilled in the art of MEMS process. Reference still to FIG. 5, in some cases, the oxide layer 222 doesn't have to be removed. It can be utilized for future processes if it is desired to do so.

Figure 6A:
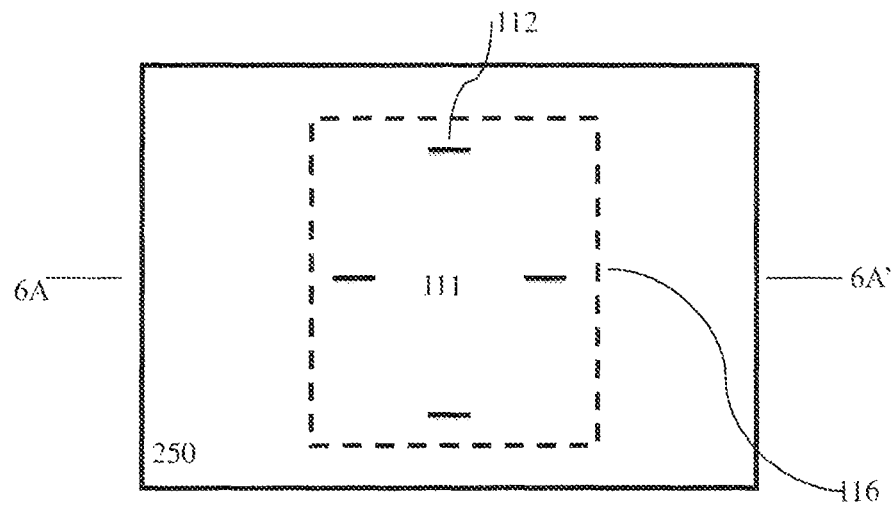
FIG. 6A illustrates the top view of the piezoresistive sensor after the formation of the piezoresistors according to one embodiment of the present invention.
Figure 6B:
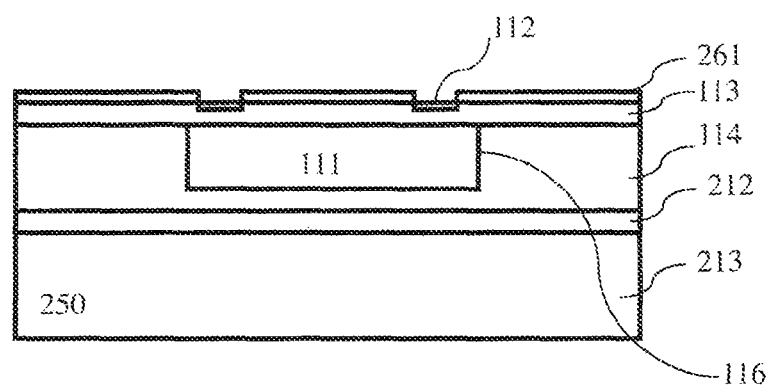
FIG. 6B illustrates the cross-sectional view of the piezoresistive sensor after the formation of the piezoresistors. The cross-sectional view is along line 6A-6A' of FIG. 6A.

Next, one or more piezoresistors 112 can be formed on top of the silicon layer 113. FIG. 6A illustrates the top view of the piezoresistive sensor 10 after the one or more piezoresistors 112 are formed on a wafer 250. FIG. 6B shows the cross-sectional view, cutting along line 6A-6A' of FIG. 6A, of the piezoresistive sensor 10 after forming the piezoresistors 112.

Figure 7:
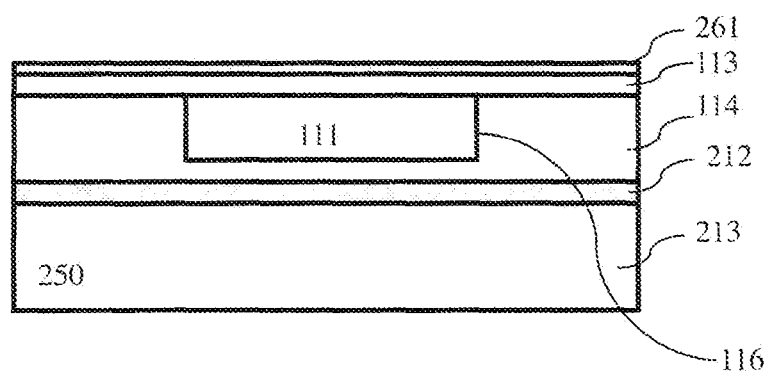
FIG. 7 and FIG. 8 illustrate the steps of forming the piezoresistors.

As illustrated in FIG. 7, first, a thin layer of a silicon dioxide insulation layer 261 is deposited on top of the silicon layer 113. The silicon dioxide insulation layer may have a thickness of around about 1 μm. Second, a mask with openings is used to form and define the pattern and shape of the one or more piezoresistors 112 using photolithography techniques.

Figure 8:
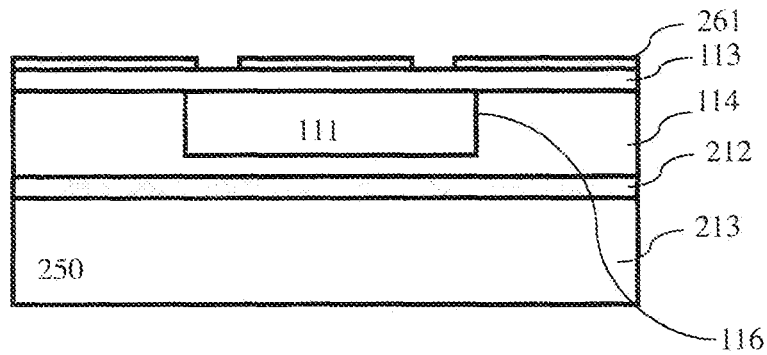

After photolithography, as illustrated in FIG. 8, a portion of the silicon dioxide insulation layer 261 in the opening areas is removed, thereby exposing a portion of the silicon layer 113. Then, one or more piezoresistors 112 are formed on the exposed surfaces of the silicon layer 113, using diffusion or ion implantation processing techniques. Accordingly, the locations of the piezoresistors 112 are defined by the opening areas in the silicon dioxide insulation layer 261 and should be within an edge 116 of the cavity 111 to maximize the sensitivity of the pressure sensor 10. The edge 116 of the cavity 111 is represented by the dotted line 116 in FIG. 6A. In the case where an ion implantation process is employed to form the piezoresistors 112, the ion implantation process is followed by a high temperature annealing process with typical temperature of 800 to 1100 degree Celsius to drive the implanted ions into the silicon and to repair the damage on the silicon crystals created by the implantation process.

Reference still to FIG. 6A, it should be apparent that the number of the piezoresistors 112 don't have to be four, even though four piezoresistors are illustrated in the figure. In fact, the number of piezoresistors 112 can be from one to any number.

Reference still to FIG. 6B and FIG. 7, in the case the oxide layer 222 of the second SOI wafer 220 is not removed, the oxide layer 222 can be used directly without depositing a new layer of oxide, hence the steps deposition of a thin layer of insulation layer of silicon dioxide 261 can be skipped.

Figure 9A:
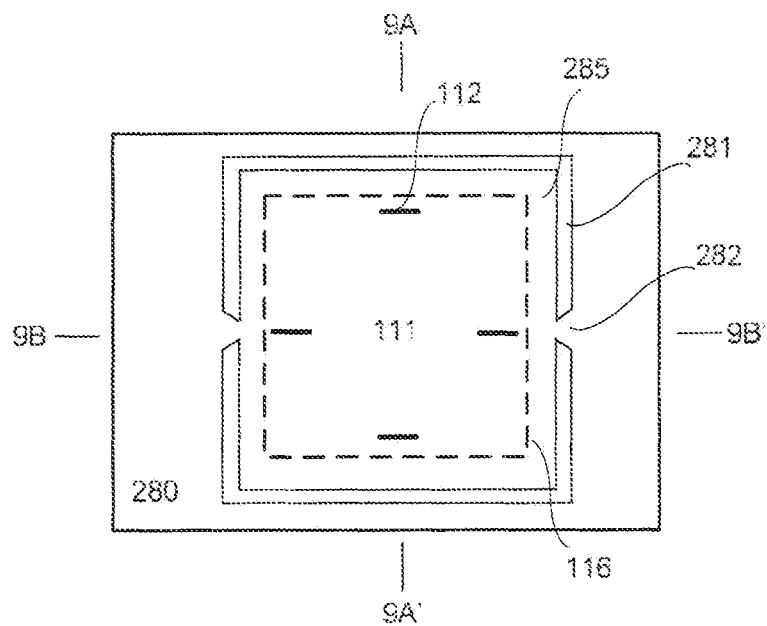
FIG. 9A through FIG. 10 illustrate the steps of forming the trench according to one or more embodiments of the present invention.
Figure 9B:
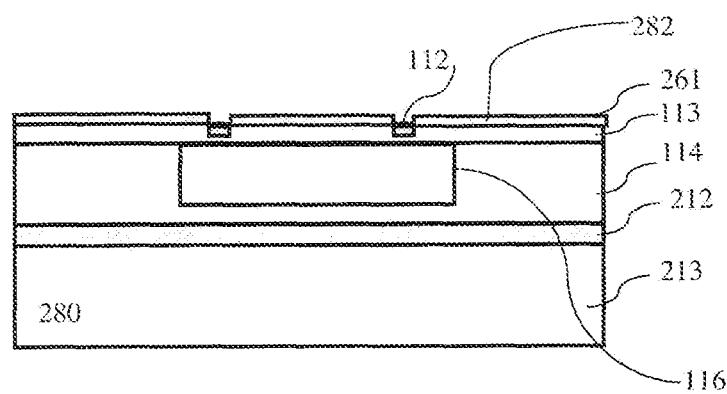
Figure 9C:
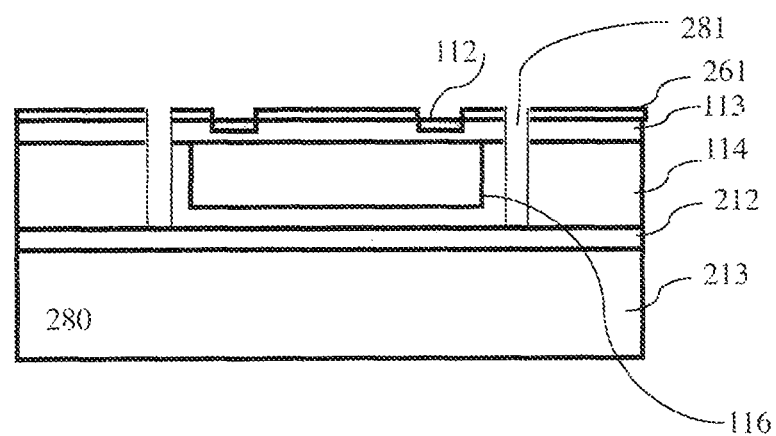

Next, one or more trenches 281 are formed to define the boundary of the pressure sensor 10. FIG. 9A illustrates the top view of a sensor 280 on the first SOI wafer 210, after forming the trenches 281 enclosing one or more piezoresistors 112. FIG. 9B illustrates the cross-sectional view of the wafer 280 after the formation of the trench 281. The cross-sectional view in FIG. 9B is along line 9B-9B' of FIG. 9A. FIG. 9C illustrates another cross-sectional view of the wafer 280 after the formation of the trench 281. The cross-sectional view in FIG. 9C is along line 9A-9A' of FIG. 9A.

First, a mask with openings is used to define the trenches 281, using photolithography techniques. The width of the trench 281 can be several micrometers to several hundred micrometers and is not critical, as long as the trenches 281 are etched completely through the oxide layer 261, the silicon layer 113, and the silicon layer 114. The boundary of the trench 281 is outside of the edge 116 of the cavity 111, leaving some space 285 between the cavity 111 and the trench 281, so that the cavity 111 is not affected. The silicon material within the space 285 is going to support the diaphragm area in the silicon layer 113 after the trench 281 has been formed. The width of the space 285 is designed so that the silicon material remained within the space 285 is strong enough to tolerate any stress during the handling a device of the pressure sensor 10. The width of the space 285 is typically from 5 µm to 50 µm.

Figure 10:
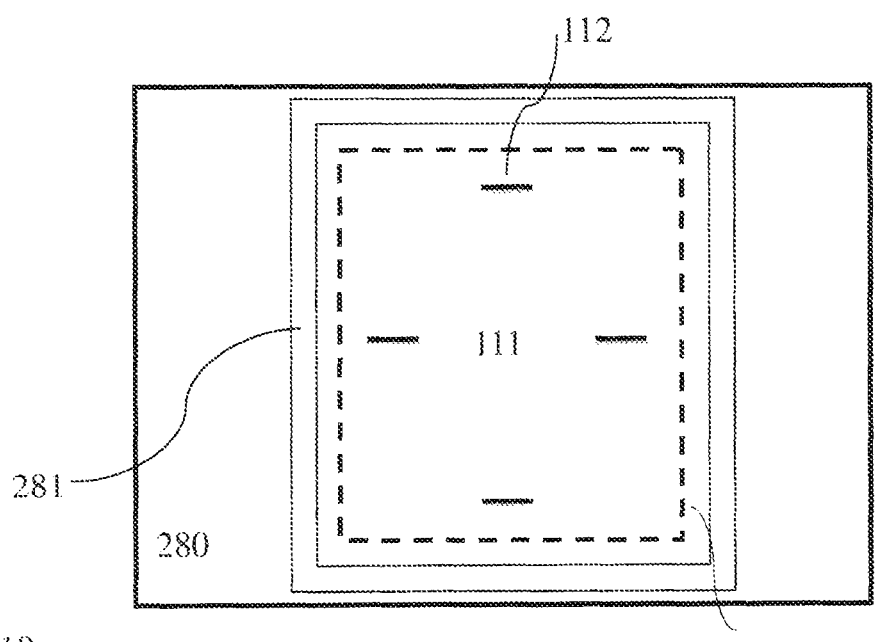

Reference still to FIG. 9A, FIG. 9B and FIG. 9C, in one embodiment, the trench 281 does not completely enclose the inner sensor area so the sensor 280 is still partially connected across its surface through an area 282, which may include a thin portion of the silicon dioxide layer 261, the silicon layer 113 and the silicon layer 114, as shown in FIG. 9A and FIG. 9B. In another embodiment, as shown in FIG. 10, the trench 281 can completely enclose the piezoresistive sensor area on the sensor 280.

The shape of the area 282, which connects the inner portion of the pressure sensor with the outer surrounding portion of the sensor 280, is designed to be in a shape that can be easily broken at the edge close to the center of the sensor so as to define the dimension of the finished sensor. One way is to design the shape of the area 282 as a trapezoid shape, whose narrower base is facing the center of the sensor 280 while the wider base is facing away from the center of the sensor 280. The ratio of the width of the narrow side to the width of the wider side is preferably smaller or equal to 0.75. In such a design, when force is applied on the later steps to release the sensor 280 from the first SOI wafer 210, the narrower side is going to break first, hence a well defined sensor dimension can be achieved.

The width of the narrower side of the area 282 is not critical as long as it is narrow enough so the area 282 can be easily broken to release the sensor 280 from the first SOI wafer 210 at later steps. A typical design width of the narrower side of the area 282 is 10 µm to 50 µm. The shape of the area 282 does not need to be trapezoid, but any shape whose width of the side facing the center of the sensor is smaller than the width of the side facing away from the sensor. In addition, the number of the area 282 is not critical and can be any number, for example, there may be two, as shown in FIG. 9A as an example, or four of the area 282 on the two or four sides of the wafer 280. Further, the locations of the area 282 are not critical, even though the preferable locations of the area 282 is in the middle of the sides of the wafer sensor 280, as shown as an example in FIG. 9A.

After the photolithography, a portion of the silicon dioxide insulation layer 261, the silicon layer 113, and the silicon layer 114 in the opening area are removed, for example, by an etching process, to form the trenches 281, stopping at the silicon dioxide layer 212 of the first SOI wafer 210. Once, a pattern of the trenches 281 is formed, the silicon dioxide insulation layer 261 can be completely removed, for example, by an etching process. In some cases, the silicon dioxide insulation layer 261 is not removed and can also be used for future processing steps.

Figure 11A:
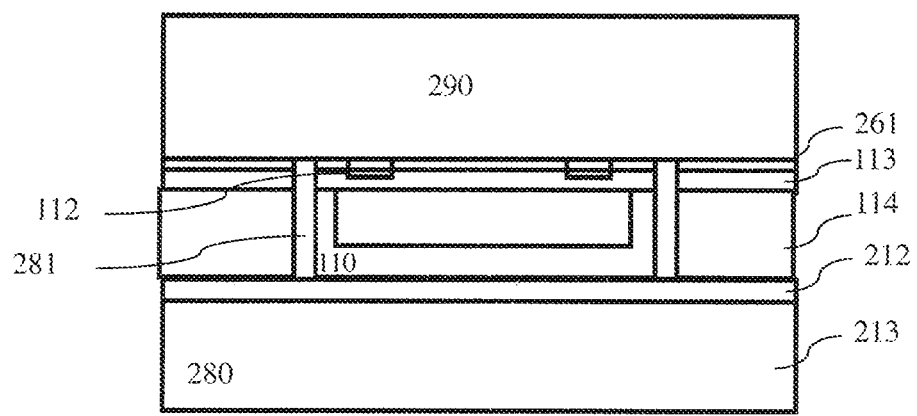
FIGS. 11A and 11B illustrate the steps of removing a bulk silicon layer and an insulation layer of the carrier SOI wafer and release the piezoresistive sensor according to one or more embodiments of the present invention.

The next steps are to release the sensors 280 from the first SOI wafer 210. In one example, as shown in FIG. 11A, where the trench 281 completely encloses the cavity 111 without forming the area 282, the sensor side of the first SOI wafer 210, having one or more sensors 280, is attached to a holding material 290 through glue or other material. The holding material 290 holds the one or more sensors 280 fabricated on the first SOI wafer 210 in place. Then, the bulk silicon layer 213 of the first SOI wafer 210 is removed.

Figure 11B:
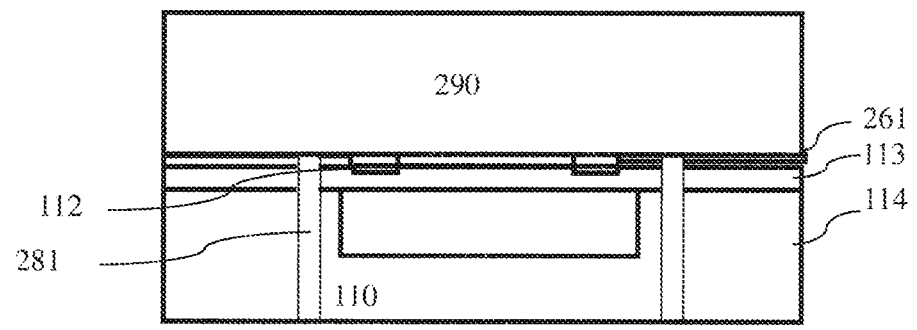

As shown in FIG. 11B next, the dioxide layer 212 of the first SOI wafer 210 is removed. After removing the dioxide layer 212, the sensors 280 are only connected with the holding material 290 by glue or other material. The glue, which holds the sensors 280 can be removed, for example, under ultraviolet (UV) light curing, as glue materials become non-adhesive after being exposed to UV light for a certain time.

The holding material 290 can be a transparent material such as glass or plastic materials. After the bulk silicon layer 230 and the dioxide layer 212 are removed, the sensor device can be exposed to UV light and released from the holding material 290. Accordingly, pressure sensors thus fabricated can be easily released from the holding material 290 without dicing.

In the example where the trench 281 does not not completely enclose the inner sensor area where the piezoresistors 112 are located, the area 282 may remain near the trench 281 after, the bulk silicon layer 213 and the oxide layer 212 of the first SOI wafer 210 are etched away. The only material holding the sensors in one piece is the area 282, which is narrow at the inner edge closer to the center of the sensor. Thus, a force can be applied by a sharp tool such as a knife to break the connection and the sensors can be released one by one. Since the inner side edge of the area 282 facing the center of the sensor is smaller compared to the outer side edge of the area 282 facing away from the sensor, the inner side facing the center of the sensor is going to break first when a mechanical force is applied, accomplishing a well defined boundary for the sensor.

From the foregoing, it can be seen that there has been provided a method to manufacture an ultra-miniature pressure sensor whose dimensions are precisely defined. In addition, there has been provided a method which uses only silicon compatible process to manufacture a pressure sensor. Compared with conventional method of fabricating a silicon diaphragm piezoresistive sensor, the present invention has at least the advantages of: (1) The dimensions of the finished sensors are precisely defined. The sensitivity of the sensor can hence be optimized. (2) The height of the finished sensor is precisely defined. (3) No dicing process is required. The sensor can be released by all semiconductor compatible processes.

While the foregoing is directed to embodiments of the present invention, other and further embodiments of the invention may be devised without departing from the basic scope thereof, and the scope thereof is determined by the claims that follow.

What is claimed is:

1. A method of fabricating a piezoresistor pressure sensor, comprising:
    providing a first silicon-on-insulator structure comprising a first silicon layer deposited on a first oxide layer over a first bulk silicon layer;
    providing a second silicon-on-insulator structure comprising a second silicon layer deposited on a second oxide layer over a second bulk silicon layer;
    bonding the first silicon layer and the second silicon layer together with the first silicon layer and the second silicon layer facing each other;
    removing the second bulk silicon layer;
    removing the second oxide layer, thereby leaving the second silicon layer of the second silicon-on-insulator structure overlying the first silicon layer;
    forming one or more openings of predetermined shape and dimension to expose a portion of the second silicon layer;
    forming one or more piezoresistors on the one or more openings of the second silicon layer;

forming a patterned trench within the second silicon layer and the first silicon layer, stopping at the first oxide layer;

removing the first bulk silicon layer, thereby forming the piezoresistor pressure sensor within the patterned trench.

2. The method of claim 1, wherein the first silicon layer has a thickness of between about 5 μm and about 100 μm.

3. The method of claim 1, wherein the second silicon layer has a thickness of between about 0.5 μm and about 5 μm.

4. The method of claim 1, wherein the first silicon-on-insulator structure is provided with a patterned cavity already formed within the first silicon layer.

5. The method of claim 1, further comprising:
forming a patterned cavity on the surface of the first silicon layer of the silicon-on-insulator structure.

6. The method of claim 1, wherein the patterned trench within the second silicon layer and the first silicon layer is positioned to partially enclose a patterned cavity within the first silicon layer, thereby leaving an area, the area having a shape on the surface of the second silicon layer, where an inner edge of the area on the surface facing the patterned cavity is narrower than an outer edge of the area facing away from the patterned cavity.

7. The method of claim 6, wherein a ratio of a first width of the inner edge of the area to a second width of the outer edge of the area is less than or equal to 0.75.

8. The method of claim 1, wherein the patterned trench within the second silicon layer and the first silicon layer is positioned to completely enclose a patterned cavity within the first silicon layer.

9. The method of claim 1, wherein the one or more piezoresistors are formed within the openings of the seconds silicon layer by diffusion.

10. The method of claim 1, wherein the one or more piezoresistors are formed within the openings of the seconds silicon layer by ion implantation.

11. The method of claim 1, further comprising:
forming a silicon oxide insulation layer on the second silicon layer after the second oxide layer is removed.

12. The method of claim 1, wherein the silicon oxide insulation layer is removed prior to forming the one or more piezoresistors on the one or more openings of the second silicon layer.

13. The method of claim 1, wherein the silicon oxide insulation layer is not removed prior to forming the one or more piezoresistors on the one or more openings of the second silicon layer.

14. The method of claim 1, wherein the first silicon layer of said wafer comprises a p-type silicon material and the second silicon layer comprises a n-type silicon material.

15. The method of claim 1, wherein the first silicon layer of said wafer comprises a n-type silicon material and the second silicon layer comprises a p-type silicon material.

16. The method of claim 1, further comprising;
removing the second oxide layer after removing the first bulk silicon layer.

17. The method of claim 1, wherein the first silicon layer has a thickness of between about 5 μm and about 100 μm.

18. The method of claim 1, wherein the second silicon layer has a thickness of between about 0.5 μm and about 5 μm.

19. A method of fabricating a piezoresistor pressure sensor, comprising:
providing a first silicon-on-insulator structure comprising a first silicon layer deposited on a first oxide layer over a first bulk silicon layer;

forming a patterned cavity on the surface of the first silicon layer of the silicon-on-insulator structure;

providing a second silicon-on-insulator structure comprising a second silicon layer deposited on a second oxide layer over a second bulk silicon layer;

bonding the first silicon layer and the second silicon layer together with the first silicon layer and the second silicon layer facing each other;

removing the second bulk silicon layer;

removing the second oxide layer, thereby leaving the second silicon layer of the second silicon-on-insulator structure overlying the first silicon layer;

forming one or more openings of predetermined shape and dimension to expose a portion of the second silicon layer;

forming one or more piezoresistors on the one or more openings of the second silicon layer;

forming a patterned trench within the second silicon layer and the first silicon layer, stopping at the first oxide layer;

removing the first bulk silicon layer, thereby forming the piezoresistor pressure sensor within the patterned trench.

20. A method of fabricating a piezoresistor pressure sensor, comprising:
providing a first silicon-on-insulator structure comprising a patterned cavity formed on a surface of a first silicon layer deposited on a first oxide layer over a first bulk silicon layer;

providing a second silicon-on-insulator structure comprising a second silicon layer deposited on a second oxide layer over a second bulk silicon layer;

bonding the first silicon layer and the second silicon layer together with the first silicon layer and the second silicon layer facing each other;

removing the second bulk silicon layer;

removing the second oxide layer, thereby leaving the second silicon layer of the second silicon-on-insulator structure overlying the first silicon layer;

forming a silicon oxide insulation layer on the second silicon layer after the second oxide layer is removed;

forming one or more openings of predetermined shape and dimension to expose a portion of the second silicon layer;

forming one or more piezoresistors on the one or more openings of the second silicon layer;

forming a patterned trench within the second silicon layer and the first silicon layer, stopping at the first oxide layer;

removing the first bulk silicon layer, thereby forming the piezoresistor pressure sensor within the patterned trench.

* * * * *